United States Patent [19]

Baylock

[11] Patent Number: 4,815,041

[45] Date of Patent: Mar. 21, 1989

[54] CURRENT SURGE ELIMINATION FOR CMOS DEVICES

[75] Inventor: Gerald A. Baylock, Aberdeen

[73] Assignees: American Telephone and Telegraph Company, New York, N.Y.; AT&T Bell Laboratories, Murray Hill, N.J.

[21] Appl. No.: 27,768

[22] Filed: Mar. 19, 1987

[51] Int. Cl.$^4$ .............................................. G11C 13/00
[52] U.S. Cl. ..................... 365/233; 365/189; 365/229
[58] Field of Search ............... 365/203, 207, 208, 189, 365/229, 230, 233

[56] References Cited

U.S. PATENT DOCUMENTS 3,778,784  12/1973  Karp et al. ........................... 365/233
4,627,032  12/1986  Kolwicz et al. ...................... 365/203

*Primary Examiner*—Terrell W. Fears
*Attorney, Agent, or Firm*—Thomas Stafford

[57] ABSTRACT

A possible surge current which can develop during power initialization of CMOS circuit arrangements or at other instances, because of loss of an actual clock signal, is eliminated by controllably supplying an alternate clock signal to the CMOS devices in the circuit during intervals in which the actual clock signal is absent. The presence or absence of the actual clock signal is monitored continuously and when present, the actual clock signal is controllably supplied to the CMOS devices in place of the alternate clock signal.

9 Claims, 1 Drawing Sheet

CURRENT SURGE ELIMINATION FOR CMOS DEVICES

TECHNICAL FIELD

This invention relates to circuit arrangements including CMOS devices and, more particularly, to current surge elimination for such circuit arrangements.

BACKGROUND OF THE INVENTION

CMOS elements, i.e., complementary metal-oxide semiconductors, typically are employed in a complementary switch configuration commonly used as an inverter. However, the complementary switch configuration may equally be employed for other logic functions, for example, a NAND gate or the like. A large number of such CMOS inverters are usually implemented on a single semiconductor chip and a plurality of such chips may be used in a particular circuit arrangement. One such CMOS inverter configuration and an associated transmission gate form a CMOS device and are shown in FIG. 2 of the Drawing. As shown in FIG. 2, the inverter includes a p-channel MOSFET (metal oxide semiconductor field effect transistor) and a n-channel MOSFET.

It has been determined that during intervals in which an actual clock signal of appropriate magnitude and/or frequency is not being supplied to the CLOCK IN input of the CMOS device an indeterminate potential condition exists at the gate inputs of the MOSFETs. This indeterminate potential at the MOSFET gate inputs causes the p-channel MOSFET and the n-channel MOSFET to appear as short circuits thereby connecting the source of potential (+) from a regulated power supply (not shown) directly to a reference potential, in this example ground potential. This indeterminate potential condition may exist for all of the CMOS devices used in a particular circuit arrangement and usually occurs during power initialization of the circuit arrangement. The current demand on the regulated power supply created by the short circuit caused by many or all of the CMOS devices usually exceeds the current capacity of the power supply. Such a condition is commonly referred to as a surge current condition. Consequently, the power supply protective circuitry limits its output current which, in turn, causes the CMOS devices to remain inoperative. This condition obviously is undesirable. A simple solution to this problem could be to use a higher current capacity power supply. This is undesirable because of cost and size.

SUMMARY OF THE INVENTION

The surge current problem related to CMOS device(s) is overcome, in accordance with an aspect of the invention, by controllably supplying at least one alternate clock signal to the CLOCK IN input of the CMOS device(s) during intervals in which at least one so-called actual clock signal having appropriate characteristics is not being supplied thereto.

More specifically, at least one so-called pseudo clock signal having a prescribed magnitude is supplied as the alternate clock signal to the CLOCK IN input of the CMOS device(s) during intervals in which at least one actual clock signal having appropriate characteristics is absent.

Additionally, the CMOS device(s) are enabled to function properly, in accordance with an aspect of the invention, by detecting the presence of at least one actual clock signal and, then, controllably switching the clock signal supplied to the CLOCK IN input of the CMOS device(s) from the at least one pseudo clock signal to the at least one actual clock signal. The presence of the at least one actual clock signal having the appropriate characteristics is monitored continuously and upon detection of its absence, the pseudo clock signal is controllably switched to the CLOCK IN input of the CMOS device(s).

BRIEF DESCRIPTION OF THE DRAWING

The invention will be more fully understood from the following detailed description of an illustrative embodiment when taken in connection with the appended figures, in which.

DETAILED DESCRIPTION

Figure 1:
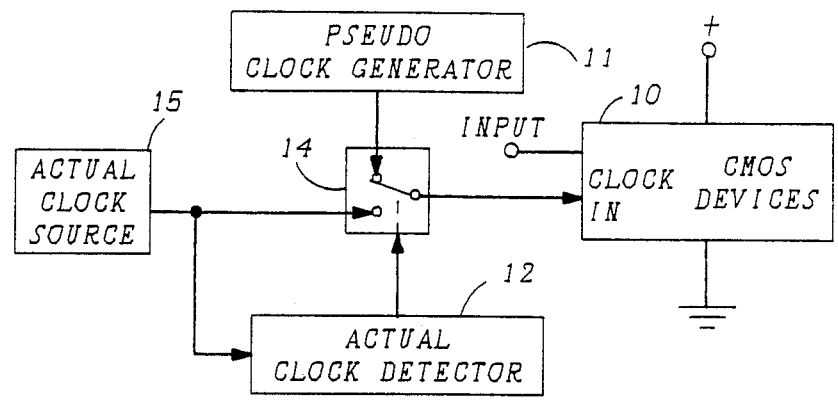
FIG. 1 shows in simplified block diagram form an embodiment of the invention.
Figure 2:
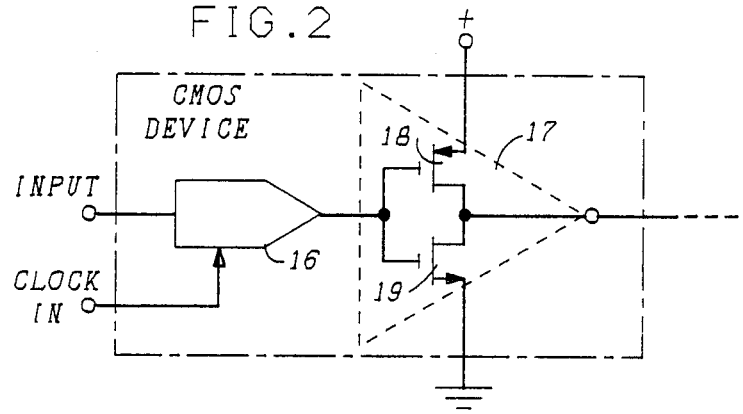
FIG. 2 depicts a CMOS device arrangement useful in describing the embodiment of FIG. 1.

FIG. 1 shows in simplified block diagram form details of one embodiment of the invention. Accordingly, shown is circuit arrangement 10 including at least one CMOS device. Typically, a large number of the CMOS devices may be included in one or more very large-scale integrated circuit (VLSI) chips. One such CMOS device is shown in FIG. 2 and described below. A predetermined potential (+), for example, 5 volts, is supplied to the CMOS devices from a regulated power supply (not shown). The CMOS devices are connected between potential (+) and a reference potential, in this example, ground potential. A clock signal is supplied to the CLOCK IN input of circuit arrangement 10 and, therein, to the CMOS devices. For simplicity and clarity of description, only a single input and single CLOCK IN input are shown to circuit arrangement 10. It will be apparent to those skilled in the art that multiple such inputs may be employed. Also shown in FIG. 1 are pseudo clock generator 11, actual clock detector 12, controllable switch 14 and actual clock source 15.

FIG. 2 shows details of a CMOS device that may be used in circuit arrangement 10 of FIG. 1. Shown are transmission gate 16 and inverter 17. Transmission gate 16 is normally responsive to an actual clock signal supplied via the CLOCK IN input to supply a signal at its INPUT to the input of inverter 17. Inverter 17 includes p-channel MOSFET 18 and n-channel MOSFET 19. The gate terminals of MOSFETs 18 and 19 are connected together and form the output of transmission gate 16. The source terminal of MOSFET 18 is connected to a source of potential (+) from a regulated power supply (not shown). The drain terminals of MOSFETs 18 and 19 are connected together and to the output of inverter 17. The source terminal of MOSFET 19 is connected to a reference potential, in this example ground potential. In certain applications, the source terminal of MOSFET 19 could be connected to a source of negative potential and the source terminal of MOSFET 18 could be connected to the reference potential. It should be noted that in a CMOS transmission gate, such as gate 16, because of the internal MOSFET configuration an indeterminate state can develop at its output. This indeterminate state will continue until an appropriate clock signal is supplied to the CLOCK IN input of gate 16. Consequently, when the actual clock signal is not being supplied to the CLOCK IN input or otherwise does not have appropriate characteristics, for example, magnitude and/or frequency, an indeterminate potential may develop at the output of transmission gate 16. In response to the indeterminate potential from transmission gate 16, MOSFETs 18 and 19 may be both biased ON thereby appearing as short circuits and, hence, connecting the potential (+) from the regulated power supply directly to ground potential. This direct connection causes excessive current, i.e., a surge current, to be drawn from the power supply supplying potential (+). When many of the CMOS devices are in such a state, the current limiting circuitry used on regulated power supplies causes the power supply to cut off the supply of potential (+) leaving the CMOS devices inoperative. The present invention is directed toward eliminating the surge current condition.

Returning to FIG. 1, pseudo clock generator 11 generates a so-called pseudo clock, i.e., an alternate clock, signal having a prescribed magnitude and a prescribed frequency. Preferably, pseudo clock generator 11 includes a plurality of inverter gates (not shown) connected in a ring configuration for generating the pseudo clock signal in well-known fashion. In this example, the magnitude of the pseudo clock signal is approximately 2.6 volts or greater and has a frequency approximately equal to the actual clock signal. The pseudo clock signal is supplied to one terminal of controllable switch 14. Controllable switch 14 may be any one of known switching elements.

A so-called actual clock signal is supplied from actual clock source 15 to a second terminal of controllable switch 14 and to actual clock detector 12. The actual clock signal is the "normal" clock signal that is typically supplied to CMOS devices on VLSI chips. In this example, the actual clock signal has a magnitude of 5 volts and a frequency of approximately 1.0 MHz. The actual clock signal may be absent or otherwise not have satisfactory characteristics during power initialization of circuit arrangement 10 and/or during other intervals of circuit arrangement 10 operation. Actual clock detector 12 is employed, in accordance with an aspect of the invention, to detect whether an actual clock signal having appropriate characteristics is present from source 15. A control signal output from actual clock detector 12 indicative of the presence or absence of the actual clock signal is supplied to controllable switch 14. Details of one arrangement which may be advantageously employed for actual clock detector 12 are shown in FIG. 3 and described below.

Operation of the embodiment of the invention shown in FIG. 1 is as follows. Actual clock detector 12 continuously monitors for the presence or absence of the actual clock signal from source 15 and generates a control signal having a first state and a second state indicating that the actual clock signal is absent, for example, a logical 1, and present, for example, a logical 0, respectively. When the actual clock signal is absent, controllable switch 14 in response to the first state of the control signal supplies the so-called pseudo clock signal to the CLOCK IN input of circuit arrangement 10 and, therein, to the CMOS devices. The pseudo clock signal has an appropriate magnitude and frequency which eliminates the indeterminate voltage condition from occurring at the gates of the MOSFETs in the CMOS inverters. Consequently, the excessive current demands on the regulated power supply are avoided. The pseudo clock signal, however, does not provide for proper operation of the CMOS devices in circuit arrangement 10. Proper operation of the CMOS devices in circuit arrangement 10 is provided, in accordance with an aspect of the invention, by actual clock detector 12 continuously monitoring for the presence of the actual clock signal from source 15. Upon detection of the presence of the actual clock signal, controllable switch 14 in response to the second state of the control signal supplies the actual clock signal to the CLOCK IN input of circuit arrangement 10 and, therein, to the CMOS devices. Thus, proper operation of the CMOS devices is effected. If for any reason the actual clock signal is lost or otherwise does not have the appropriate characteristics, actual clock detector 12 will generate the first state of the control signal. Controllable switch 14, in response to the first state of the control signal, supplies the pseudo clock signal to the CLOCK IN input of circuit arrangement 10 and, therein, to the CMOS devices. Therefore, it is seen that the possibility of excessive current demand on the regulated power supply is avoided both during power initialization of circuit arrangement 10 and during other intervals that the actual clock signal is lost or does not have appropriate characteristics.

Figure 3:
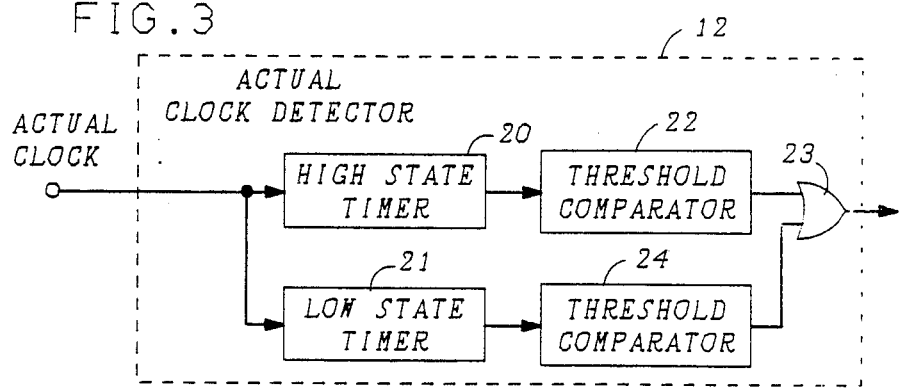
FIG. 3 shows in simplified block diagram form details of the actual clock detector used in the embodiment of FIG. 1.

FIG. 3 shows in simplified block diagram form details of actual clock detector 12 of FIG. 1. Actual clock detector 12 is used to determine if an actual clock signal from source 15 (FIG. 1) is present or absent. The presence of the actual clock signal is detected by the high state and the low state of the actual clock signal from source 15 each being present for less than a predetermined interval. If either the high state or the low state of the actual clock signal from source 15 is present for more than the predetermined interval, the actual clock signal is considered to be absent. To this end, the actual clock signal from source 15 is supplied to high state timer 20 and low state timer 21. High state timer 20 generates a signal indicative of the interval that the actual clock signal from source 15 having a magnitude greater than a predetermined value is present. This interval is the so-called high state interval and is compared to a first predetermined threshold interval in threshold comparator 22. If the high state interval is longer than the first predetermined threshold interval, the actual clock signal is considered to be absent and threshold comparator 22 generates the first state of the control signal, namely, a logical 1. Otherwise, threshold comparator 22 generates the second state of the control signal, namely, a logical 0. Similarly, low state timer 21 generates a signal indicative of the interval that the clock signal from source 15 has a magnitude less than a predetermined value. This interval is the so-called low state interval and is compared to a second predetermined threshold interval in threshold comparator 24. If the low state interval is longer than the second predetermined threshold interval, the actual clock signal is considered to be absent and threshold comparator 24 also generates the first state of the control signal. Otherwise, threshold comparator 24 generates the second state of the control signal, namely, a logical 0. In this example, the low state and high state, i.e., first and second, threshold intervals are equal. The control signal is supplied via OR gate 23 to controllable switch 14 (FIG. 1).

Although the embodiment of the invention has been described using a single actual clock signal and a single alternate clock signal, a plurality of actual clock signals and a corresponding plurality of alternate clock signals may be used with other CMOS device configurations.

What is claimed is:

1. Apparatus including at least one CMOS device adapted to be connected to a power source and adapted to be supplied with at least one actual clock signal, comprising:

means for detecting the absence of the at least one actual clock signal, said means for detecting includes means for detecting a first interval that the at least one actual clock signal is in a first predetermined state and a second interval that the at least one actual clock signal is in a second predetermined state, means for comparing said first interval to a first predetermined threshold interval and means for comparing said second interval to a second predetermined threshold interval, said means for detecting generates a control signal having a first predetermined state when said first interval is longer than said first threshold interval or when said second interval is longer than said second threshold interval indicating that said at least one actual clock signal is absent and a second predetermined state of said control signal otherwise indicating that said at least one actual clock signal is present; and means for controllably supplying at least one alternate clock signal to said at least one CMOS device during intervals in which said at least one actual clock signal is absent, said means for controllably supplying includes controllable switching means responsive to said first state of said control signal for supplying said at least one alternate clock signal to said at least one CMOS device and to said second state of said control signal for supplying the at least one actual clock signal to said at least one CMOS device.

2. The apparatus as defined in claim 1 wherein said first and second threshold intervals are equal.

3. The apparatus as defined in claim 2 further including a source of the at least one actual clock signal, the at least one actual clock signal having a predetermined magnitude and frequency.

4. The apparatus as defined in claim 3 further including a source of said at least one alternate clock signal, said at least one alternate clock signal having a prescribed magnitude and a frequency approximately equal to the at least one actual clock signal frequency.

5. Apparatus including a plurality of CMOS devices adapted to be connected to a power source and adapted to be supplied with at least one clock signal, comprising:

a source of at least one actual clock signal;

a source of at least one alternate clock signal;

means for detecting the absence of said at least one actual clock signal, said means for detecting includes means for detecting a first interval that said at least one actual clock signal is in a first predetermined state and a second interval that said at least one actual clock signal is in a second predetermined state, means for comparing said first interval to a first predetermined threshold interval and means for comparing said second interval to a second predetermined threshold interval, said means for detecting generates a control signal having a first predetermined state when said first interval is longer than said first threshold interval or when said second interval is longer than said second threshold interval indicating that said at least one actual clock signal is absent and a second predetermined state of said control signal otherwise indicating that said at least one actual clock signal is present; and means for controllably supplying said at least one alternate clock signal to the plurality of CMOS devices when said at least one actual clock signal is absent, said means for controllably supplying includes controllable switching means responsive to said first state of said control signal for supplying said at least one alternative clock signal to the plurality of CMOS devices and to said second state of said control signal for supplying said at least one actual clock signal to the plurality of CMOS devices.

6. The apparatus as defined in claim 5 wherein said first and second threshold intervals are equal.

7. The apparatus as defined in claim 6 where said at least one actual clock signal has a predetermined magnitude and frequency and wherein said at least one alternate clock signal has a predetermined magnitude and a frequency approximately equal to said at least one actual clock signal frequency.

8. The apparatus as defined in claim 7 wherein said plurality of CMOS devices is on at least one VLSI chip.

9. A surge current elimination method for at least one CMOS device adapted to be connected to a power source and to be supplied with at least one actual clock signal, comprising the steps of, detecting a first interval that the at least one actual clock signal is in a first predetermined state and a second interval that the at least one actual clock signal is in a second predetermined state, comparing said first interval to a first predetermined threshold interval, comparing said second interval to a second predetermined threshold interval, generating a control signal having a first predetermined state when said first interval is longer than said first threshold interval or when said second interval is longer than said second threshold interval indicating that said at least one actual clock signal is absent and a second predetermined state of said control signal otherwise indicating that said at least one control signal is present, and controllably supplying at least one alternate clock signal to said at least one CMOS device during intervals that said first state of said control signal is generated and controllably supplying said at least one actual clock signal to said at least one CMOS device during intervals that said second state of said control signal is generated.

* * * * *